United States Patent
Ellwood et al.

(10) Patent No.: US 12,489,319 B2
(45) Date of Patent: Dec. 2, 2025

(54) WIRELESS CHARGING WITH HYBRID SIN/SQUARE RECONFIGURABLE RF WAVEFORM

(71) Applicant: Renesas Design Austria GmbH, Graz (AT)

(72) Inventors: Stephen Ellwood, Graz (AT); Lukas Niederwieser, Graz (AT)

(73) Assignee: Renesas Design Austria GmbH, Graz (AT)

( * ) Notice: Subject to any disclaimer, the term of this patent is extended or adjusted under 35 U.S.C. 154(b) by 0 days.

(21) Appl. No.: 18/823,127

(22) Filed: Sep. 3, 2024

(65) Prior Publication Data
US 2025/0132606 A1  Apr. 24, 2025

(30) Foreign Application Priority Data

Oct. 18, 2023 (EP) .................................. 23204398

(51) Int. Cl.
| | |
|---|---|
| H02J 50/20 | (2016.01) |
| H01Q 3/28 | (2006.01) |
| H02J 50/23 | (2016.01) |
| H02J 50/40 | (2016.01) |
| H03F 1/02 | (2006.01) |
| H03F 3/195 | (2006.01) |
| H03F 3/21 | (2006.01) |
| H03F 3/217 | (2006.01) |
| H03F 3/72 | (2006.01) |
| H03M 1/66 | (2006.01) |
| H03M 1/76 | (2006.01) |

(52) U.S. Cl.
CPC ............... H02J 50/23 (2016.02); H01Q 3/28 (2013.01); H02J 50/402 (2020.01); H03F 1/02 (2013.01); *H03F 2200/249* (2013.01); *H03F 2200/451* (2013.01)

(58) Field of Classification Search
CPC .......... H02J 50/23; H02J 50/402; H02J 50/20; H02J 7/00; H01Q 3/28; H03F 1/02; H03F 2200/249; H03F 2200/451; H03F 3/245; H03F 3/195; H03F 3/211; H03F 3/2175; H03F 3/2178; H03F 3/72; H03F 3/20; H03F 3/213; H03F 3/21; H03F 3/217; H03M 1/765; H03M 1/662; H03M 1/66; H03M 1/76; H03G 9/02
USPC ......................................................... 307/149
See application file for complete search history.

(56) References Cited

U.S. PATENT DOCUMENTS

2018/0367106 A1* 12/2018 Crols ...................... H03F 3/195

* cited by examiner

*Primary Examiner* — Rexford N Barnie
*Assistant Examiner* — Xuan Ly
(74) *Attorney, Agent, or Firm* — SCULLY, SCOTT, MURPHY & PRESSER, P.C.

(57) ABSTRACT

A digital power amplifier to drive an RFID antenna with an antenna signal of a substantial sinusoidal output current. This digital power amplifier includes a switching element built to switch at least one of the 2*W driver blocks from a contributing mode into a none-contributing mode, in which none-contributing mode the driver block does not contribute with an increment of charge to the output current to adjust the amplitude and/or the waveform of the output signal.

7 Claims, 4 Drawing Sheets

WIRELESS CHARGING WITH HYBRID SIN/SQUARE RECONFIGURABLE RF WAVEFORM

FIELD

The present invention relates to a digital power amplifier to drive an RFID antenna with an antenna signal.

BACKGROUND

Wireless charging is used for all kind of different portable devices like a mobile phone or earphones. The two earphones have to be put into a storage box with a power device that comprises one or two RFID antennas to generate and emits a magnetic field of the power device to charge the two earphones wireless. In some of these systems, the power device just emits the magnetic field and some newer systems comprise a feedback loop from the portable device to the power device to regulate the power of the magnetic field to emit more or less output power.

Such a system is for instance described in a European patent application with the application number 22167055.7 (filed Apr. 7, 2022) which describes wireless charging based on the NFC Forum™ Technical Specification Version 1.0 as explained below. The power device 1 is a reader called "poller" and comprises an antenna that emits a magnetic field with the frequency of 13.56 MHz and a sin-waveform of the carrier signal. The portable device is a tag called "listener" and comprises an antenna exposed to the magnetic field emitted by the power device. An adaption or matching circuit matches the impedance of the output pins of the antenna to input pins of a rectifier that uses a bridge rectifier to rectify the antenna signal and to provide a direct DC voltage. A charge stage of the portable device is used to charge the battery of the portable device. Charge stage comprises a charger IC that needs a power voltage of 5V+/−10% and a DC/DC converter is used to convert the direct DC voltage provided by rectifier to an appropriate input voltage at an input pin of charge stage. The battery is a Li-Ion battery that needs to be charged by the charge stage in different time periods with different charge currents and charge voltages. The charge stage furthermore comprises a digital control stage that generates a power adjustment information in case the input voltage at the input pin and/or the charge current to charge the battery are too low or too high. Such power adjustment information is provided by the digital control stage to a Cless Communication stage, which complies to the NFC communication protocol to communicate the power adjustment information to the power device. With this feedback loop from portable device to power device, the charge stage can request more or less power in the magnetic field provided by the power device. This increase of decrease of power in the magnetic field is achieved by a higher or lower amplitude or a different waveform of the carrier signal of the magnetic field.

Today two different NFC power amplifier topologies for power devices exist, one using square waves followed by filtering, the second using direct sin wave synthesis as disclosed in EP3182585B1. Power devices which work on the square wave principle generate the fundamental, but also the odd harmonics of the carrier frequency of 13.56 MHz. These harmonics have to be filtered out using a passive filter. The resistance of the inductors within the filters lead to high thermal losses when transmitting high powers such as those needed for wireless charging since resistive losses are proportional to the square of the current.

The power amplifier disclosed in EP3182585B1 comprises a number of W driver blocks connected to a first output pin and further W driver blocks connected to a second output pin of the power amplifier. Each of these parallel arranged driver blocks comprises a level shifter and a buffer or inverter and a series capacitor which is loaded to a charge stage depending on the waveform of the signal to be output at the first and second output pin. These parallel capacities of all driver blocks are loaded with the particular charge stage with a clock frequency M-times the transmission frequency of the magnetic field used for wireless charging of the battery of the portable device. The sum of the charges in these charge stages is provided at the first and second output pin and realizes the output current of the power amplifier. The use of such a power amplifier as shape stage in the transmitter stage of the power device comprises the advantage that only the bit combination at the input pins of the driver blocks needs to be adjusted to switch between different waveforms provided at the output pins of the driver stage. It is therefore easy and very energy efficient to switch between waveforms like sin-, sawtooth or rectangular. Any other waveform is possible to realize, just by changing the bit combination at the input pins of the driver blocks. Therefore this direct sin wave synthesis with the power amplifier disclosed in EP3182585B1 uses a capacitive DC to AC converter to construct a substantial sinusoidal output current which can be directly passed through a matching circuit to the RFID antenna. This is more efficient at high power than the power amplifiers that generate a square wave, but becomes less efficient at lower amplitudes and less power in the antenna signal.

SUMMARY

It is an object of the invention to at least provide a digital power amplifier and a system of a power device with such a digital power amplifier and a portable device for wireless powering of the load of the portable device, which enables an efficient power transfer and power adjustment possibilities.

This digital power amplifier according to the invention comprises switching means built to switch at least one of the 2*W driver blocks from a contributing mode into a none-contributing mode, in which none-contributing mode the driver block does not contribute with an increment of charge to the output current to adjust the amplitude and/or the waveform of the output signal. This enables to reduce the power transferred in the magnetic field emitted by the RFID antenna without adopting the digital wave-forming bit combination with the digital control section that processes on high frequency. This reduces the power needs of the digital power amplifier.

It is furthermore advantageous, if the digital control section is built to reduce the output power of the antenna signal with the substantial sinusoidal output current by stepwise symmetrically switching those of the 2*W driver blocks into the none-contributing mode that enable to cut-off the highest amplitude of the positive and the negative halfwaves of the substantial sinusoidal output current and with each step transform the waveform of the substantial sinusoidal output voltage into a more and more substantial square wave output voltage. As a result, this digital power amplifier produces a substantial sinusoidal output current at high power amplitudes, removing the need for external passive filtering. However, as the output power required goes down, the output becomes more trapezoidal until at low powers it becomes indistinguishable from a square wave. As the power goes down, the harmonics do increase as a proportion of the carrier, but since the carrier amplitude is decreasing the absolute harmonic energy content remains low enough to obviate the need for external filtering.

It is furthermore advantageous to store the digital wave-forming bit combination to generate the substantial sinusoidal output current and/or to store a clip-value for a switching code for switching means of the digital control section to stepwise reduce or increase the output power of the antenna signal in a memory of the digital control section. The use of this stored information enables to generate different waveforms of the output signal with the digital power amplifier and to stepwise reduce the power of the output signal and in the magnetic field with reduced power needs of the high frequency digital control section. This memory with stored information for the digital power amplifier operates at 13.56 MHz and enables that the generation of the substantial sinusoidal output current can be hard coded, simplifying it and reducing the power required to generate it. A typical generation of the substantial sinusoidal output current built on a 26 nm process would consume 3 mA, the solution with the memory and stored lookup table would consume less than 1 mA.

The sin wave generation can be shared across multiple power amplifiers. This is particularly important in true wireless stereo applications, where two power amplifiers are needed to support independent charging of two wireless listeners. The synchronization between the modulator and the power amplifier is decreased since there is no need to synchronize the sin wave lookup (W signals) on every clock cycle. The power amplifier itself is responsible for synchronizing the needed amplitude at each power amplifier zero crossing.

These and other aspects of the invention will be apparent from and elucidated with reference to the embodiments described hereinafter. The person skilled in the art will understand that various embodiments may be combined.

BRIEF DESCRIPTION OF THE DRAWINGS

FIG. 3 lower part shows the substantial sinusoidal output current of the antenna signal, which is a via the antenna inductance filtered version of the output voltage at transmission output pins.

DETAILED DESCRIPTION OF EMBODIMENTS

Figure 1:
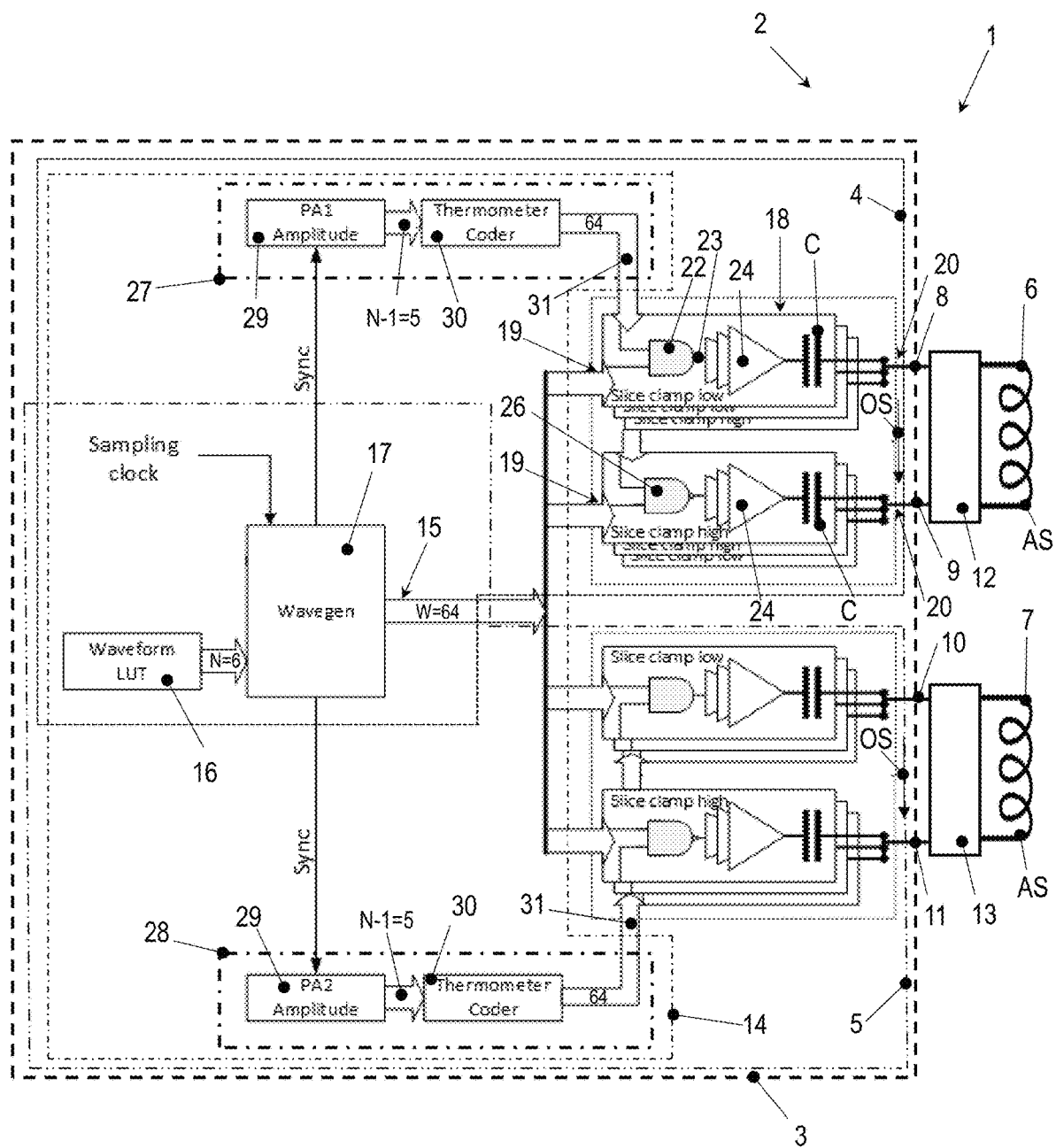
FIG. 1 shows a power device with a digital power amplifier of a system according to the invention, which power device is used to wireless load the batteries of a portable device.

FIG. 1 shows a power device 1 of a system 2 according to a first embodiment of the invention. System 2 furthermore comprises two portable earphones for the left and the right ear of a user, which earphones are not shown in FIG. 1. Such a system 2 may be used for various use cases, where two or more antennas with the same or different power levels are required. Each of the earphones comprises an antenna connected via a matching circuit to an integrated circuit powered by a battery of the earphone. The integrated circuit of the earphone is built to harvest energy from the magnetic field generated by power device 1 for wireless powering of the batteries of the two earphones, which power device 1 is realized in a storage box for the earphones.

Power device 1 comprises an integrated circuit 3, powered by a circuitry connected to mains not shown in FIG. 1, and a first digital power amplifier 4 and a second digital power amplifier 5. Each of the digital power amplifiers 4 and 5 is built to drive an RFID antenna 6 or 7 with an antenna signal AS with a substantial sinusoidal output current. The integrated circuit 3 furthermore comprises a first transmission output pin 8 and a second transmission output pin 9 to provide an output signal OS from the first digital power amplifier 4 and comprises a third transmission output pin 10 and a fourth transmission output pin 11 to provide the output signal OS from the second digital power amplifier 5. A first adaptation circuit 12 of discrete components is connected to the first transmission output pin 8 and second transmission output pin 9 and is built to match the impedances and adapt the output signal OS to feed the substantial sinusoidal output current I with a transmission resonance frequency of 13.56 MHz to the first RFID antenna 6. A second adaptation circuit 13 of discrete components is connected to the third transmission output pin 10 and fourth transmission output pin 11 and is built to match the impedances and adapt the output signal OS to feed the substantial sinusoidal output current I with a transmission resonance frequency of 13.56 MHz to the second RFID antenna 7. In a closer technical view the digital power amplifiers 4 and 5 provide charge increments which add-up for the sinusoidal output current, what will be explained below.

Integrated circuit 3 and digital power amplifiers 4 and 5 furthermore comprise a digital control section 14 for the first digital power amplifier 4 with a number of W wave-forming contacts 15 to output a digital wave-forming bit combination wherein W=2^(number of amplitude resolution bits N) and wherein in this embodiment N=6. This digital wave-forming bit combination is provided with a clock frequency M-times the transmission resonance frequency, wherein the oversampling ration is M and in this embodiment M=64. The clock frequency in this embodiment with M=64 is 64*13.56 MHz=867.84 MHz. The number N defines the resolution or number of different amplitudes and the number M of the oversampling ration defines the time resolution or split of one period of the substantial sinusoidal output current with its transmission resonance frequency of 13.56 MHz with which the first digital power amplifier 4 drives the first RFID antenna 6. In principle the higher the numbers W and M the better and smoother the form of the substantial sinusoidal output current I of the antenna signal AS. Any other numbers/resolutions W and M may be used as well. M=64 provides a phase resolution of 360/64 degrees, about 6 degrees.

Figure 2:
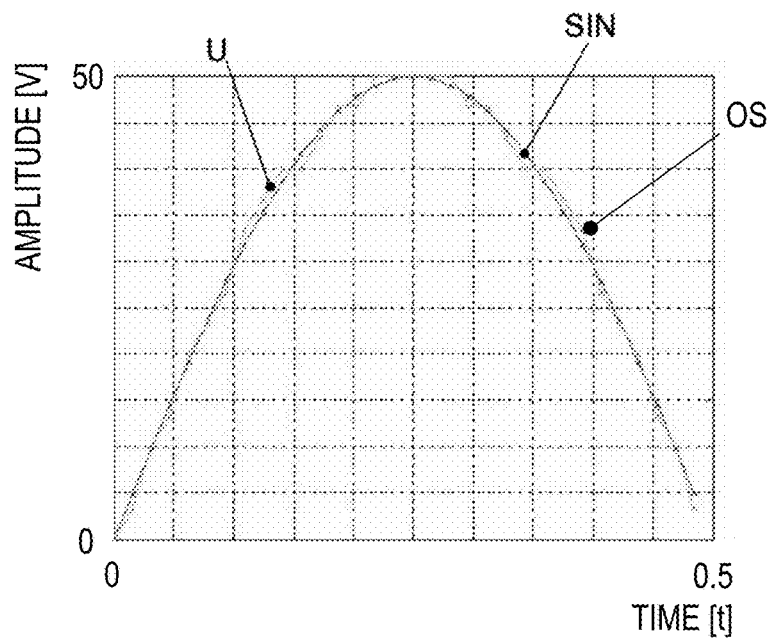
FIG. 2 shows a time diagram of the output voltage of the digital power amplifier of the system according to FIG. 1.

FIG. 2 shows an example of the substantial sinusoidal output voltage U of antenna signal OS with the maximal amplitude possible over half a period of the transmission resonance frequency at the RFID antenna 6 generated by the first digital power amplifier 4 according to FIG. 1 in comparison with a perfect sinus SIN. Such resonant output voltage U may be in the 100 Voltage peak-to-peak range or even more.

Digital control section 14 comprises a memory 16 to store a look-up-table for the digital wave-forming bit combination for the W wave-forming contacts 15 to generate the substantial sinusoidal output current and based on different clip-values to stepwise reduce or increase the output power of the antenna. To achieve that, a table with a number of M time instances each with the W digital wave-forming bit combinations for each of the data bits "0" and "1" is stored in memory 16. Digital control section 14 furthermore comprises a wave generator 17, that is built to output the M digital wave-forming bit combinations of either data bit "0" or "1" at the number of W wave-forming contacts 15 to transform data bit "0" or "1" into the substantial sinusoidal output current I of the antenna signal AS. In this embodiment a bus width of N=6 from the memory 16 to the wave generator 17 is used, in line with the amplitude resolution bits. In another embodiment of the invention only M/2 time instances of the W wave-forming bit combinations are stored and the time axis symmetric part is generated by the wave generator 17.

The first digital power amplifier 4 comprises a number of 2*W driver blocks 18, half of them connected with a first contact 19 to one of the number of W wave-forming contacts 15 and connected with a second contact 20 to the first transmission output pin 8. The other half of the 2*W driver blocks 18 is connected with their first contact 19 to one of the number of W wave-forming contacts 15 and with their second contact 20 to the second transmission output pin 9. The driver blocks 18 are built to provide increments of the charge for the substantial sinusoidal output current I to the first transmission output pin 8 and second transmission output pin 9. This means that each of the driver blocks 18, if driven with a bit "1" in the digital wave-forming bit combination, adds an increment of charge to drive for instance 5 mA for one clock period to the transmission output pin 8 or 9. All these charge increments add up to form the substantial sinusoidal output current I with for instance maximal N*5 mA=320 mA. Higher or lower increments would be possible as well.

This design of integrated circuit 3 comprises the advantage, that the output signal OS at the first and second transmission output pins 8 and 9 enables an analogue signal with a form of the antenna signal AS close to a perfect sinus SIN to satisfy the spurious emission levels required by regulations to avoid noise in other frequency ranges. Therefore, no external filter means are needed in the adaption means 12, compared to state of the art integrated circuits that use a square wave and filter it to achieve a substantial sinusoidal output current. In addition it is advantageous that the waveform of the substantial sinusoidal output current I and output signal OS may be digitally programmed by the digital control section 14 to achieve accurate output power modulation.

Those driver blocks 18 connected with their second contact 20 to the first transmission output pin 8 comprise an AND Gate 22 and the other number of W of the driver blocks 18 comprise an NAND Gate 26, which Gates 22 and 26 form logic cells and are connected with one of their input pins to the first contact 19 and therefore to the wave-forming contacts 15. Their gating functionality of the AND Gate 22 and the NAND Gate 26 will be explained below. All 2*W driver blocks furthermore comprise level shifter 24 that shift the voltage of the wave-forming contacts 15 to a higher and in particular to an at least two times higher voltage. In the embodiment disclosed, the driver blocks 18 receive an input signal in the range of 0 Volt to 1.8 Volt at their first contact 19 and shift it into an output signal in the range of 0 Volt to 5 Volt at the output of the level shifters 24. The level shifter 24 transform from the low-voltage domain of the digital control section 14 into the high voltage analog domain the output pins 8 and 9 are fed with.

Those driver blocks 18 connected to the second contact 20 to the second transmission output pin 9 comprise the NAND Gates 26 to invert the potential of the voltage provided by the wave-forming contacts 15. This enables to generate. a complementary output signal to have a differential signal chain.

Each driver block 18 furthermore comprises a series capacitor C arranged between the level shifter 24 and the second contact 20 and is fed with the voltage of the level shifters 24. This enables that the charge increments of each of the driver blocks 18 add up to a positive half wave of the driver blocks 18 connected to the first transmission output pin 8 and a negative half wave of the driver blocks 18 connected to the second transmission output pin 9 with the substantial sinusoidal output current I. Typical capacity of capacitors C would be 5 pF each, but could lower of higher as well.

Integrated circuit 3 is realized in CMOS technology and advantageously the series capacitors C are realized by Metal-Oxide-Metal capacitors that use the capacitive effect of the connecting lines within integrated circuit 3. This enables a good integration of the series capacitors C within integrated circuit 3 and allows a high output voltage.

In principle all driver blocks 18 are always conducting, even when no digital wave-forming bits are output at wave-forming contacts 15. This enables that resonance tuning is preserved and overvoltage on the driver blocks 18 is prevented. The output of the driver blocks 18 might also incorporate diode clamps to be sure that no overvoltage is present. The number of driver blocks 18 used in combination with the pulse width of the digital wave forming bits defines the output power of the power amplifier 4.

The integrated circuit 3 of the system 2 comprises the second digital power amplifier 5, that is built ident as the first digital power amplifier 4 as described above. Advantageously both digital power amplifier 4 and 5 are part of system 2 of the power device 1 and share the same digital control section 14, what reduces chip area and costs. As they are realized on in one integrated circuit 3, there are no temperature differences of their components that could lead to different output OS, what is a big advantage.

The digital control section 14 furthermore comprises inventive first switching means 27 built to adjust the amplitude and/or the waveform of the output signal OS of the first digital power amplifier 4 and second switching means 28 built to adjust the amplitude and/or the waveform of the output signal OS of the second digital power amplifier 5. First switching means 27 are built to switch at least four of the number of 2*W driver blocks 18 from a contributing mode into a none-contributing mode, in which none-contributing mode the driver block 18 does not contribute with an increment of charge to the output current I. The first switching means 27 selectively switch or enable/disable each of the 2*W driver blocks 18 into either the contributing mode or the none-contributing mode. In the none-contributing mode the driver block 18 is disconnected or none-contributing from the wave-forming contacts 15 and its capacity C does not get loaded independent on a bit "1" or a bit "0" of its relevant digital wave-forming bit contact 15. This enables to reduce the power transferred in the magnetic field to the earphones emitted by the RFID antenna 6 without adopting the digital wave-forming bit combination with the digital control section 14 that processes with the clock of the high frequency of 867.84 MHz. Both of this (capacity C not loaded and no processing of the digital control section 14 needed) reduces the power needs of the first digital power amplifier 4.

The digital control section 14 furthermore comprises the second switching means 28 built to switch or enable/disable the number of 2*W driver blocks 18 of the second digital power amplifier 5 between the contributing mode and the none-contributing mode. This provides the advantage that the power transferred from the first digital power amplifier 4 via the first antenna 6 to the first earphone may be steered different and independent from the power transferred from the second digital power amplifier 5 via the second antenna 7 to the second earphone of the system 2. As mobile phones communicate via Bluetooth® with wireless earphones and one of the two earphones has to have the Bluetooth® receiver that loads the battery of this earphone more than the battery of the other earphone is loaded. Therefore the batteries of one of the earphones might need to be charged with different power to have them both fully charged at the same time. This possibility to charge each earphone with different power in the magnetic field of the RFID antennas 6 and 7 enables to reduce the overall charging time of the earphones, which is an essential feature.

Figure 7:
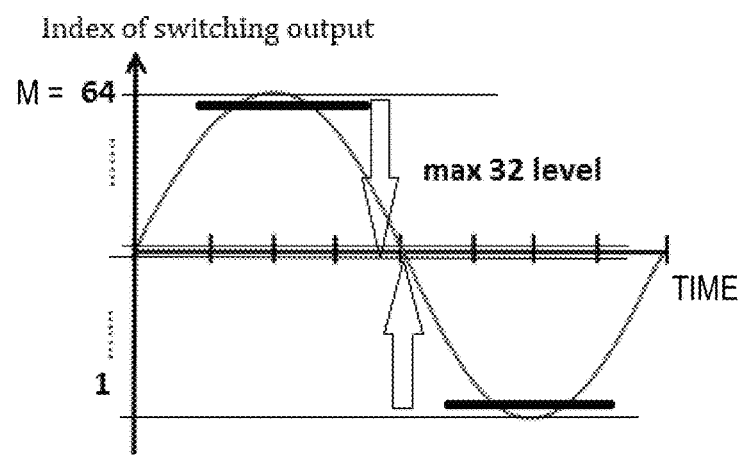
FIG. 7 shows the symmetric clipping of the waveform by the thermometer coder of the power amplifier of FIG. 1.

To switch or enable/disable between the contributing and the none-contributing mode, the first and second switching means 27 and 28 comprise an amplitude stage 29 and a thermometer coder 30. The amplitude stage 29 receives sync and other information from the digital control section 14 via the wave generator 17 with the information about the step (resolution N) to which extent the maximal output power of the substantial sinusoidal output current I should be reduced. This steers the thermometer coder 30 to generate a switching code 31 to selectively switch or enable/disable each of the 2*W driver blocks 18 into either the contributing mode or the none-contributing mode. A thermometer code or unary code is used and enables a simple switching (enabling/disabling), but other codes could be used as well to selectively connect or disconnect the driver stages 18. This thermometer coder 30 is connected with the second input pin of the AND Gate 22 and NAND Gate 26 and provides its switching code 31 as second input signal. This means that only, if the switching code 31 provided to the AND Gate 22 of the driver block 18 is a bit "1", the output of the digital wave-forming contact 15 provided to the AND Gate 22 of this driver block 18 contributes. It may contribute with a transition from bit "0" to bit "1" or from bit "1" to bit "0". The same, but inverted is true for the NAND Gates 26, where the switching code 31 has to provide a bit "0" to switch or enable the driver block 18 into its contributing mode to enable the contribution of the digital wave-forming contact 15 at NAND Gate 26. For those driver blocks 18, which are switched or disabled into their none-contributing mode, the second contact 20 is clamped to a fixed voltage, either high VD or low VS. The thermometer coder 30 ensures that the waveform is clipped symmetric as shown in FIG. 7. The amplitude resolution and clipping can be defined independently so for instance a bit width of the output of amplitude stage 29 with 4 bit provides an amplitude resolution of 16 levels while a bit width of 5 bit provides 32 levels. let's work on this paragraph.

Figure 3:
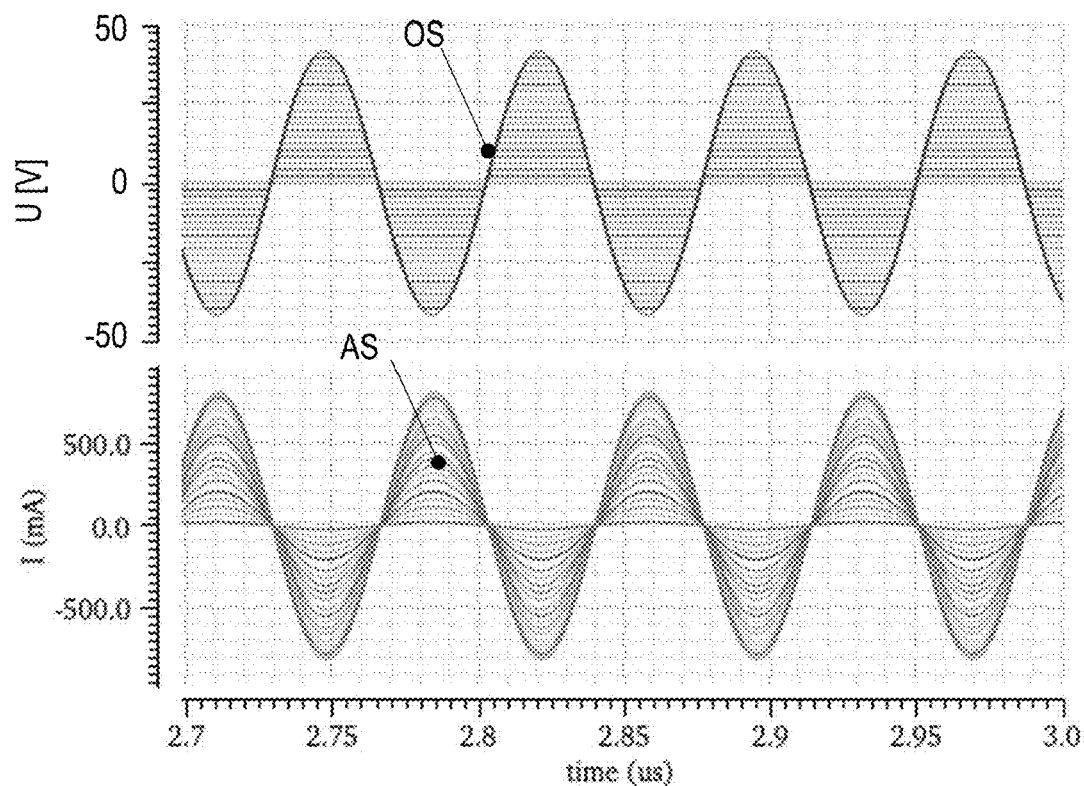
FIG. 3 upper part shows an output voltage at transmission output pins of the integrated circuit of the digital power amplifier of FIG. 1, where in different steps the highest amplitudes are cut-off to reduce the output power.

The first and second switching means 27 and 28 are built to reduce the charge increments provided at output pins 8 and 9 what cuts-off the higher amplitudes of the output signal OS and amplitude of the antenna signal AS with the substantial sinusoidal output current I (FIG. 3 lower part) is reduced. This is achieved by stepwise symmetrically switching those of the 2*W driver blocks 18 into the none-contributing mode that enable to reduce the amount of charge provide to the first transmission output pin 8 and second transmission output pin 9 and cut-off the highest amplitude of the positive and the negative halfwaves of the substantial sinusoidal output voltage U (FIG. 3 upper part). Driver blocks 18 switched into their none-contributing mode are symmetrically clamped by first switching means 27 and second switching means 28 into different claim voltages VD and VS. By lowering the output power of the power amplifier 4 the output voltage U of output signal OS more and more gets a substantial square wave form, what is low EMI problem with regard to unwanted higher harmonics, as the amplitude is already very low and the amplitude of the harmonics is not disturbing any more.

Figure 4:
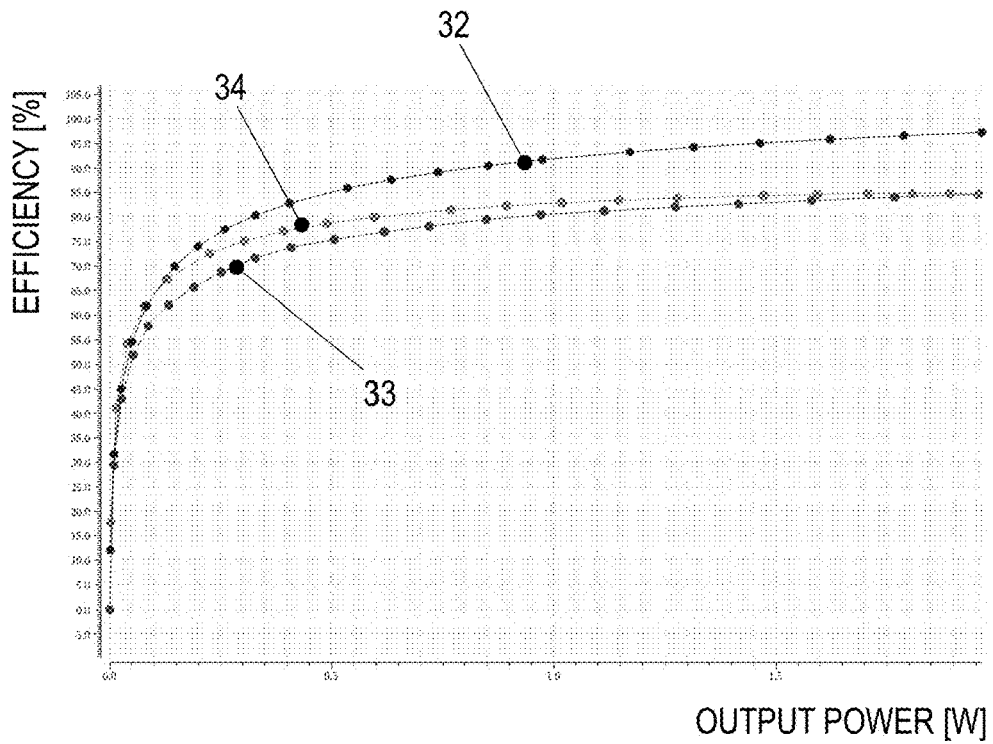
FIG. 4 shows a comparison of the efficiency over the output power for state of the art and the inventive digital power amplifiers.

FIG. 4 shows a comparison of the efficiency in % of the output power for state of the art power amplifier and the power amplifiers 4 and 5 as shown in FIG. 1. Efficiency line 32 shows the efficiency of the power amplifier based on the square wave principle, but without the needed filtering for EMI attached. Efficiency line 33 shows the efficiency of the power amplifier as disclosed in EP3182585B1. Efficiency line 34 shows the efficiency of the power amplifier 4 and 5 of the power device 1 according to FIG. 1, which uses the hybrid approach to transfer from a SIN waveform into a square waveform when reducing the output power. Although the efficiency line 32 of the square wave principle in FIG. 4 is higher than the efficiency line 34, the square wave principle suffers from losses due to filtering what further reduces the efficiency of the square wave principle and provides a better overall efficiency for the inventive power amplifiers 4 and 5.

Figure 5:
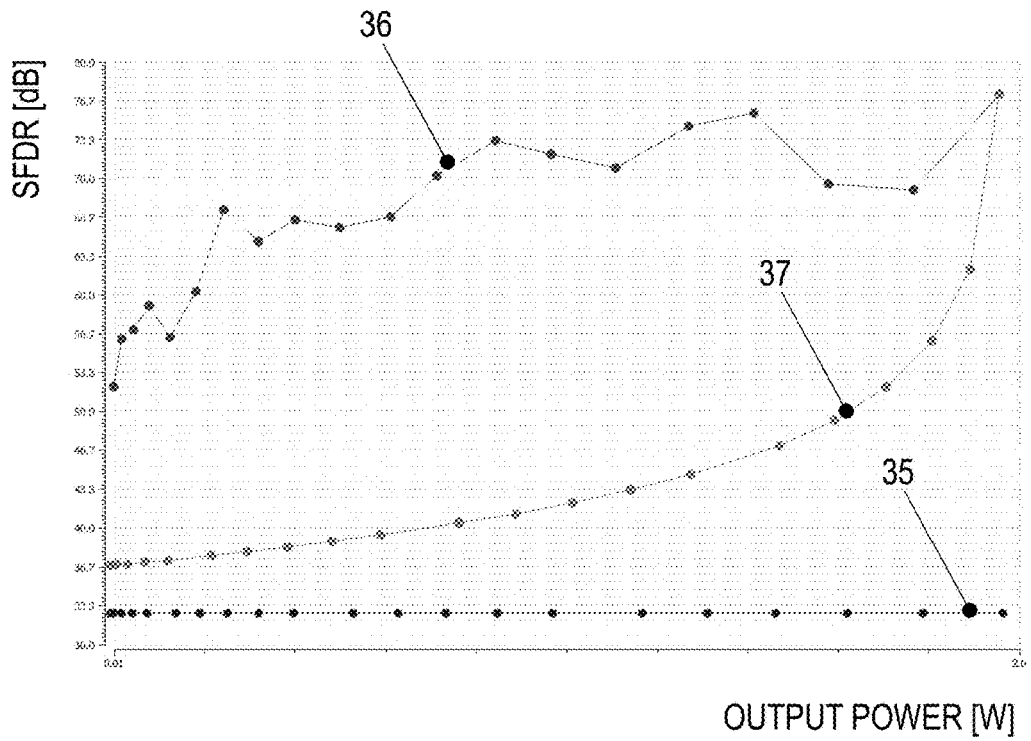
FIG. 5 shows a comparison of the spurious free dynamic range of the antenna output current over output power for state of the art and the inventive digital power amplifiers.
Figure 6:
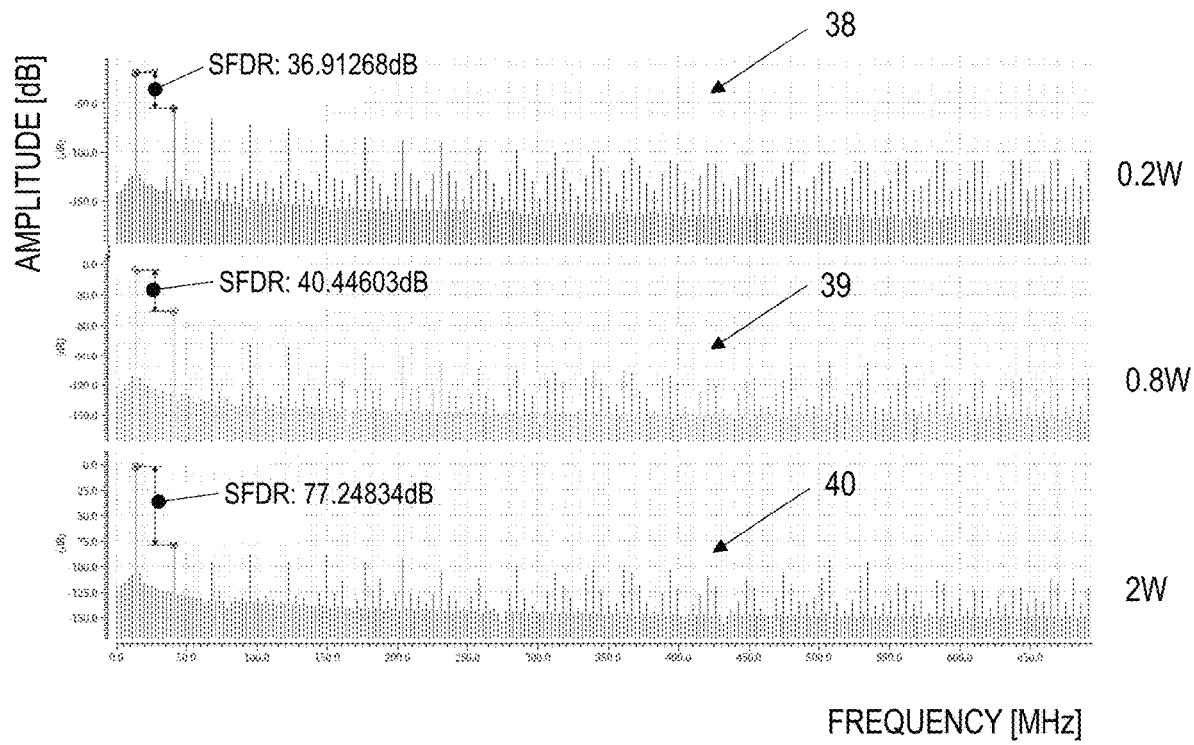
FIG. 6 shows the spectrum of the antenna output current for three different output power levels of the power amplifier of FIG. 1.

FIG. 5 shows a comparison of the spurious free dynamic range SFDR (difference of baseband amplitude and first harmonic as shown in FIG. 6) of the output power current for state of the art power amplifier and the power amplifiers 4 and 5 as shown if FIG. 1. SFDR line 35 shows the output power of the power amplifier based on the square wave principle. SFDR line 36 shows the output power of the power amplifier as disclosed in EP3182585B1. SFDR line 37 shows the output power of the power amplifier 4 and 5 of the power device 1 according to FIG. 1, which uses the hybrid approach to transfer from a SIN waveform into a square waveform when reducing the output power. This hybrid inventive approach has better harmonics than the square wave principle and transitions to the same harmonic content as the power amplifier as disclosed in EP3182585B1.

FIG. 6 shows the spectrum of power amplifiers 4 and 5 for different output power levels, representing the spectrum of the antenna current for three datapoints of output power for SFDR line 37 in FIG. 5. FIG. 6 shows the spectrum line 38 with the harmonics for datapoint 0.2 W output power of FIG. 5 with the SFDR of about 36.9 dB. Spectrum line 39 shows the spectrum of the data point for 0.8 W output power output power of FIG. 5 with the SFDR of about 40.4 dB. Spectrum line 40 shows the spectrum of the data point for 2 W output power output power of FIG. 5 with the SFDR of about 77.2 dB.

In the system 2 according to the embodiment in FIG. 1 the digital control section 14 is built to use the same digital wave-forming bit combination on the wave-forming contacts 15 for all of the W driver blocks 18 of the two digital power amplifier 4 and 5. Furthermore the digital control section 14 is built to use the same or a different switching code 31 for the two switching means 27 and 28 of the power amplifier 4 and 5 to enable to output the same power to both of the two portable earphones or to output more power to one of the two portable earphones. This enables the advantage to customize the output power for charging to the power needs of the two batteries of the earphones.

In a further embodiment of the invention the 2*W driver blocks of both power amplifier share the same level shifters 24 to shift the voltage provided at the wave-forming contacts 15 to a higher voltage while the AND and NAND Gates are located in the high voltage domain. This reduces complexity and chip area.

The advantages of the invention have been explained with the application to wireless charge two earphones, but the invention could be used in any other wireless charging or powering application too. Furthermore additional digital power amplifier could be added to the system and the power device to enable further antennas to be powered with independent magnetic fields with less or more output power.

With the power amplifier as disclosed in EP3182585B1 the waveform of the antenna signal AS may be adjusted to output a SIN or triangle or square waveform, whatever is need. With the invention described in this document, the amplitude and power of the chosen waveform may be reduced in an effective way as explained above. In some embodiments of the invention, both the waveform and the amplitude and power of the antenna signal AS may be adjusted by switching some of the driver blocks into the none-contributing mode.

The invention claimed is:

1. A digital power amplifier to drive an RFID antenna with an antenna signal of an output current, the digital power amplifier comprising:
   an integrated circuit having a first transmission output pin and a second transmission output pin to provide an output signal;
   an adaption circuit of discrete components connected to the first transmission output pin and the second transmission output pin to adapt the output signal and feed the substantial sinusoidal output current with a transmission resonance frequency to the RFID antenna;
   a digital control section with a number of W wave-forming contacts to output a digital wave-forming bit combination with a clock frequency M-times the transmission resonance frequency; and
   a number of 2*W driver blocks each connected with a first contact to one of the wave-forming contacts and a number of W of them connected with a second contact to the first transmission output pin and the other number of W of them connected with their second contact to the second transmission output pin, which driver blocks are built to provide charge increments for the substantial sinusoidal output current to the first and second transmission output pin, wherein the digital control section comprises:
   switching means built to steer a logic cell in each of the driver blocks to disable at least four of the 2*W driver blocks of the digital power amplifier from a contributing mode into a none-contributing mode, in which none-contributing mode the driver block does not contribute charge for an increment to the output current, to adjust the amplitude and/or the waveform of the output signal, wherein that the digital control section is built to reduce the output power of the antenna signal with the substantial sinusoidal output current by stepwise symmetrically disabling those of the 2*W driver blocks into the none-contributing mode that enable to cut-off the highest amplitude of the positive and the negative halfwaves of the substantial sinusoidal output current and with each step transform the waveform of the substantial sinusoidal output voltage into a more and more substantial square wave output voltage.

2. The digital power amplifier according to claim 1, wherein the switching means are built to disable at least four of the 2*W driver blocks from its wave-forming contact in the none-contributing mode.

3. The digital power amplifier according to claim 1, wherein the digital control section is built to provide information to the switching means to selectively enable or disable each of the 2*W driver blocks into either the contributing mode or the none-contributing mode.

4. The digital power amplifier according to claim 3, wherein the switching means use a thermometer coder to generate a switching code to selectively enable or disable each of the 2*W driver blocks into either the contributing mode or the none-contributing mode.

5. The digital power amplifier according to claim 1, wherein the digital control section comprises a memory to store a look-up-table for the digital wave-forming bit combination to generate the substantial sinusoidal output current and/or to store a clip-value for the switching code for the switching means to stepwise reduce or increase the output power of the antenna signal.

6. A system that comprises a power device and at least one portable device for wireless powering of a load of the portable device, the power device comprising:
   at least two of the digital power amplifiers according to claim 1, wherein each of the digital power amplifiers drives an independent RFID antenna and wherein the at least two digital power amplifier share the same digital control section.

7. The system according to claim 6, wherein the digital control section is built to use the same digital wave-forming bit combination for both of the 2*W driver blocks of the two digital power amplifier and wherein the digital control section is built to use the same or a different switching code for the two switching means of the power amplifier to enable to output the same power to both of the two portable devices or to output more power to one of the two portable devices.

* * * * *